United States Patent
Kulkarni et al.

(10) Patent No.: US 10,765,039 B2
(45) Date of Patent: Sep. 1, 2020

(54) TWO-PHASE LIQUID-VAPOR COMPUTER COOLING DEVICE

(71) Applicant: Intel Corporation, Santa Clara, CA (US)

(72) Inventors: Devdatta P. Kulkarni, Portland, OR (US); Xudong Tang, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/605,802

(22) Filed: May 25, 2017

(65) Prior Publication Data

US 2018/0343773 A1 Nov. 29, 2018

(51) Int. Cl.
*H05K 7/20* (2006.01)

(52) U.S. Cl.
CPC ..... *H05K 7/20809* (2013.01); *H05K 7/20327* (2013.01); *H05K 7/20727* (2013.01)

(58) Field of Classification Search
CPC ........... H05K 7/20809; H05K 7/20172; H05K 7/30327; H05K 7/20727; H05K 7/20436; G06F 1/20; F04D 25/045
USPC ............... 361/699, 700–702; 165/80.4–80.5, 165/104.33; 257/714
See application file for complete search history.

(56) References Cited

U.S. PATENT DOCUMENTS

| | | | | |
|---|---|---|---|---|
| 4,266,602 A | * | 5/1981 | White | F28F 9/26 165/124 |
| 5,724,832 A | * | 3/1998 | Little | B01D 8/00 62/114 |
| 6,155,078 A | * | 12/2000 | Miyashita | F25J 3/04157 62/643 |
| 7,367,202 B2 | * | 5/2008 | Yamada | F25B 41/00 62/500 |
| 9,057,547 B2 | * | 6/2015 | Wightman | F25B 13/00 |
| 9,448,601 B1 | * | 9/2016 | Beall | G06F 1/187 |
| 10,548,241 B2 | * | 1/2020 | Chainer | G06F 1/206 |
| 2002/0124128 A1 | * | 9/2002 | Qiu | G06F 1/16 710/302 |
| 2005/0028552 A1 | * | 2/2005 | Nishijima | F25B 31/004 62/500 |
| 2006/0283579 A1 | * | 12/2006 | Ghosh | H01L 23/473 165/104.33 |
| 2008/0298014 A1 | * | 12/2008 | Franco | G06F 1/183 361/688 |
| 2009/0144568 A1 | * | 6/2009 | Fung | G06F 1/3203 713/300 |

(Continued)

*Primary Examiner* — Jayprakash N Gandhi
*Assistant Examiner* — Amir A Jalali
(74) *Attorney, Agent, or Firm* — Schwabe, Williamson & Wyatt, P.C.

(57) ABSTRACT

Embodiments herein relate to multi-phase cooling of electronic equipment such as processors and voltage regulators in a rack computing system. In various embodiments, a cooling device may include a heat exchanger, an inlet manifold, an outlet manifold, one or more fluid conductors coupled with the heat exchange, the inlet manifold, and the outlet manifold to carry a two-phase fluid from the outlet manifold to the inlet manifold through the heat exchanger, and one or more fans to generate a flow of air against the heat exchanger. In some embodiments, the heat exchanger may be arranged in an inverted-V or an inverted-W configuration with respect to the fans. In embodiments, the cooling device may be disposed in a rack module. Other embodiments may be described and/or claimed.

24 Claims, 7 Drawing Sheets

(56) References Cited

U.S. PATENT DOCUMENTS

| | | | | |
|---|---|---|---|---|
| 2009/0152216 A1* | 6/2009 | Champion | G06F 1/183 | |
| | | | 211/26 | |
| 2010/0328888 A1* | 12/2010 | Campbell | H01L 23/4735 | |
| | | | 361/699 | |
| 2012/0020007 A1* | 1/2012 | Collins | G06F 1/187 | |
| | | | 361/679.39 | |
| 2012/0111038 A1* | 5/2012 | Campbell | F25B 39/02 | |
| | | | 62/115 | |
| 2012/0324911 A1* | 12/2012 | Shedd | F25B 25/00 | |
| | | | 62/62 | |
| 2013/0027878 A1* | 1/2013 | Campbell | H05K 7/2029 | |
| | | | 361/694 | |
| 2014/0118920 A1* | 5/2014 | Ng | G06F 1/20 | |
| | | | 361/679.33 | |
| 2015/0159093 A1* | 6/2015 | Baird | C10G 3/50 | |
| | | | 585/639 | |
| 2017/0181329 A1* | 6/2017 | Shelnutt | H05K 7/20836 | |
| 2017/0211853 A1* | 7/2017 | Feng | F25B 13/00 | |
| 2017/0235347 A1* | 8/2017 | Heyd | G06F 1/185 | |
| | | | 361/679.31 | |
| 2017/0248350 A1* | 8/2017 | Liu | F25B 13/00 | |
| 2017/0313954 A1* | 11/2017 | Rebrovic | C10M 105/70 | |
| 2020/0029600 A1* | 1/2020 | Colina | A23L 2/60 | |

* cited by examiner

TWO-PHASE LIQUID-VAPOR COMPUTER COOLING DEVICE

FIELD

Embodiments of the present disclosure generally relate to the field of cooling devices and methods, and, more particularly, to multi-phase cooling of computer equipment.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Increasing power demands from high thermal design power (TDP) processors and other computer components require increased cooling capacity. Legacy cooling solutions in data centers have several limitations, including large air flow requirements and thermal shadowing of parts in a multi-component system.

BRIEF DESCRIPTION OF THE DRAWINGS

Embodiments of the two-phase liquid-vapor cooling apparatus and/or method may overcome these limitations. The embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
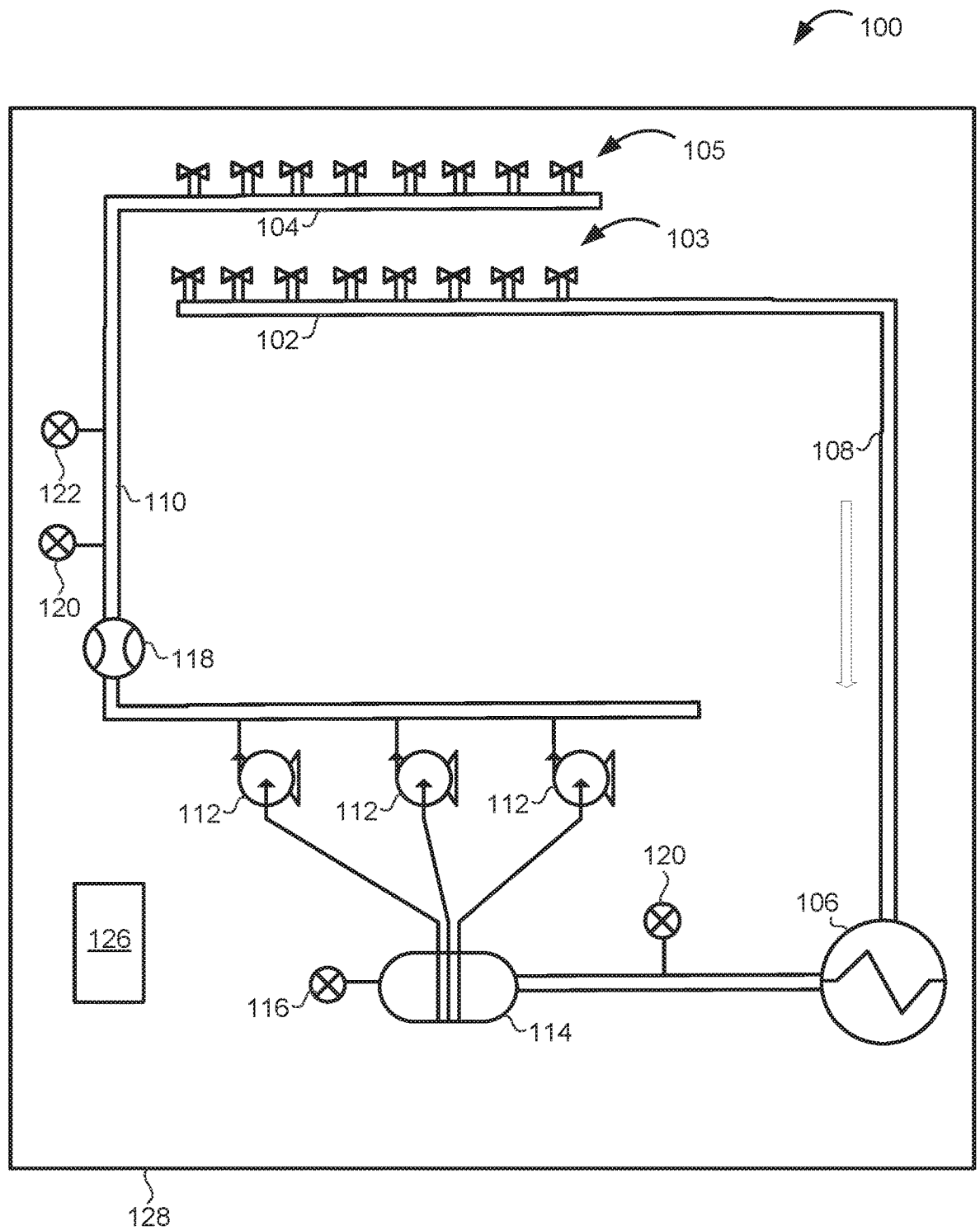
FIG. 1 illustrates a schematic view of a two-phase liquid-vapor cooling device, according to various embodiments.

Embodiments of the present disclosure describe multi-phase cooling of electronic equipment such as processors and voltage regulators in a rack computing system. In various embodiments, a cooling device may include a heat exchanger, an inlet manifold, an outlet manifold, one or more fluid conductors coupled with the heat exchanger, the inlet manifold, and the outlet manifold to carry a multi-phase fluid from the outlet manifold to the inlet manifold through the heat exchanger, and one or more fans to generate a flow of air against the heat exchanger. In some embodiments, the heat exchanger may be arranged in an inverted-V or an inverted-W configuration with respect to the fans.

In some embodiments, the cooling device may be disposed in a rack module to cool N (e.g., eight) nodes. In various embodiments, the rack module with the cooling device may be disposed in a rack with M other rack modules, each of which may include a cooling device to cool less than or equal to N nodes such that greater than N but less than or equal to N(1+M) nodes may be cooled by the 1+M rack modules. It should be understood that this illustrates the modularity of the cooling device according to various embodiments, but that the cooling capacity, modularity, and/or scalability may be configured in a different manner in other embodiments.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. It will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

FIG. 1 illustrates a schematic view of a two-phase liquid-vapor cooling device 100, according to various embodiments. In embodiments, the two-phase liquid-vapor cooling device 100 may be referred to as a central distribution unit (CDU). In various embodiments, the two-phase liquid-vapor cooling device 100 may use a refrigerant fluid that absorbs heat into the fluid using the heat of vaporization as it travels through one or more devices coupled with the two-phase liquid-vapor cooling device 100, and dissipates heat by releasing the heat of condensation at the two-phase liquid-vapor cooling device 100. In some embodiments, the two-phase liquid-vapor cooling device 100 may include an outlet manifold 102, an inlet manifold 104, and a heat exchanger 106. In embodiments, the outlet manifold 102 may include one or more quick disconnects 103 and the inlet manifold 104 may include one or more quick disconnects 105 to connect fluid conductors (e.g., tubing) to the fluid carrying components of compute devices to be cooled. An arrow is shown indicating a direction of fluid flow in operation, according to some embodiments.

In various embodiments, a first fluid conductor 108 may carry a multi-phase fluid (e.g., a 2-phase liquid-vapor mixture) from the outlet manifold 102 to the heat exchanger 106. In some embodiments, the multi-phase fluid may change to a single phase fluid (e.g., a liquid) as it passes through the heat exchanger 106. In various embodiments, a second fluid conductor 110 may carry the single phase fluid to the inlet manifold 104 after it has passed through the heat exchanger 106. In some embodiments, the multi-phase fluid from the first fluid conductor 108 may remain as a multi-phase fluid as it passes through the heat exchanger 106, but the vapor quality level may change. In various embodiments, the liquid and vapor may be separated in a reservoir 114 and only a single phase fluid (e.g., the liquid) may be pumped to the second fluid conductor 110 via one or more pumps 112. In some embodiments, the two-phase liquid-vapor cooling device 100 may include one or more additional fluid conductors and/or a different number of fluid conductors than shown in FIG. 1. In various embodiments, the heat exchanger 106 may be liquid-to-air heat exchanger or a liquid-to-liquid heat exchanger. In some embodiments, the two-phase liquid-vapor cooling device 100 may include one or more fans (not shown for clarity) to generate a flow of air against the heat exchanger 106.

In various embodiments, the two-phase liquid-vapor cooling device 100 may use pumped liquid multi-phase cooling (PLMC) and may include the one or more pumps 112 coupled with one or more fluid conductors (e.g., first fluid conductor 108 and/or second fluid conductor 110) to pump the multi-phase fluid from the outlet manifold 102 to the inlet manifold 104 through the heat exchanger 106. In some embodiments, the two-phase liquid-vapor cooling device 100 may include reservoir 114 that may include a filling port 116. As shown, the reservoir 114 may be coupled with the heat exchanger 106 and/or the one or more pumps 112. However, it should be understood that the reservoir 114 may be coupled with other components (e.g., first fluid conductor 108 or second fluid conductor 110) in some embodiments.

In some embodiments, the two-phase liquid-vapor cooling device 100 may include one or more sensors to sense one or more physical characteristics of the multi-phase fluid. In various embodiments, the one more sensors may include one or more flow meters 118 (e.g., a liquid flow meter) to measure a flow of the multi-phase fluid, one or more pressure sensors 120, one or more temperature sensors 122, and/or one or more other types of sensors (e.g., a fluid level sensor at the reservoir 114, not shown for clarity). In various embodiments, a vapor quality may be directly sensed, or may be calculated based at least in part on one or more sensed physical characteristics (e.g., determined using calculations based at least in part on heat load, mass flow rate, and temperature). In some embodiments, one or more sensors, not shown for clarity, may be located in other locations (e.g., along first fluid conductor 108, and/or at outlet manifold 102).

In some embodiments, a controller 126 may control the one or more pumps 112, the one or more fans, and/or other components of the two-phase liquid-vapor cooling device 100 based at least in part on the one or more sensed physical characteristics of the multi-phase fluid. In various embodiments, the controller 126 may be coupled with one or more of the flow meters 118, pressure sensors 120, temperature sensors 122, pumps 112, fans, other sensors, and/or other components of the two-phase liquid-vapor cooling device 100. In various embodiments, the one or more sensed physical characteristics may include a flow rate, a vapor quality level, a temperature, and/or some other sensed physical characteristic of the multi-phase fluid. In various embodiments, the controller 126 may calculate a vapor quality level of the multi-phase fluid based at least in part on one or more sensed physical characteristics (e.g., a flow rate and/or a temperature). In various embodiments, the vapor quality level may be calculated by the controller 126 for one or more locations in the two-phase liquid-vapor cooling device 100 (e.g., in the first fluid conductor 108, and/or at the outlet manifold 102). In some embodiments, the controller 126 may control the one or more pumps 112, the one or more fans, and/or other components based at least in part on a sensed flow rate, a calculated or sensed vapor quality level, and/or a sensed temperature. In some embodiments, the controller 126 may control the one or more pumps 112 and/or the one or more fans to maintain a vapor quality of approximately 70% to 80% of the multi-phase fluid in the first fluid conductor 108. In various embodiments, the controller 126 may control the one or more pumps 112 and/or the one or more fans to maintain a different vapor quality level and/or to maintain a vapor quality level at a different point in the two-phase liquid-vapor cooling device 100 (e.g., at the outlet manifold 102). The controller 126 may be or may include a microcontroller, a central processing unit, a field programmable gate array (FPGA), an application specific integrated circuit (ASIC), or any other suitable component in various embodiments.

In embodiments, one or more components of the two-phase liquid-vapor cooling device 100 may be disposed in a chassis 128. In various embodiments, the quick disconnects 103 of the outlet manifold 102 and/or the quick disconnects 105 of the inlet manifold 104 may be at the back of the chassis 128, the front of the chassis 128, or some other location. The controller 126 is shown inside the chassis 128 as a part of the cooling device 100, but in other embodiments, the controller 126 and/or some or all functions of the controller 126 may be located separately (e.g., in a rack-level or data center level controller).

Figure 2:
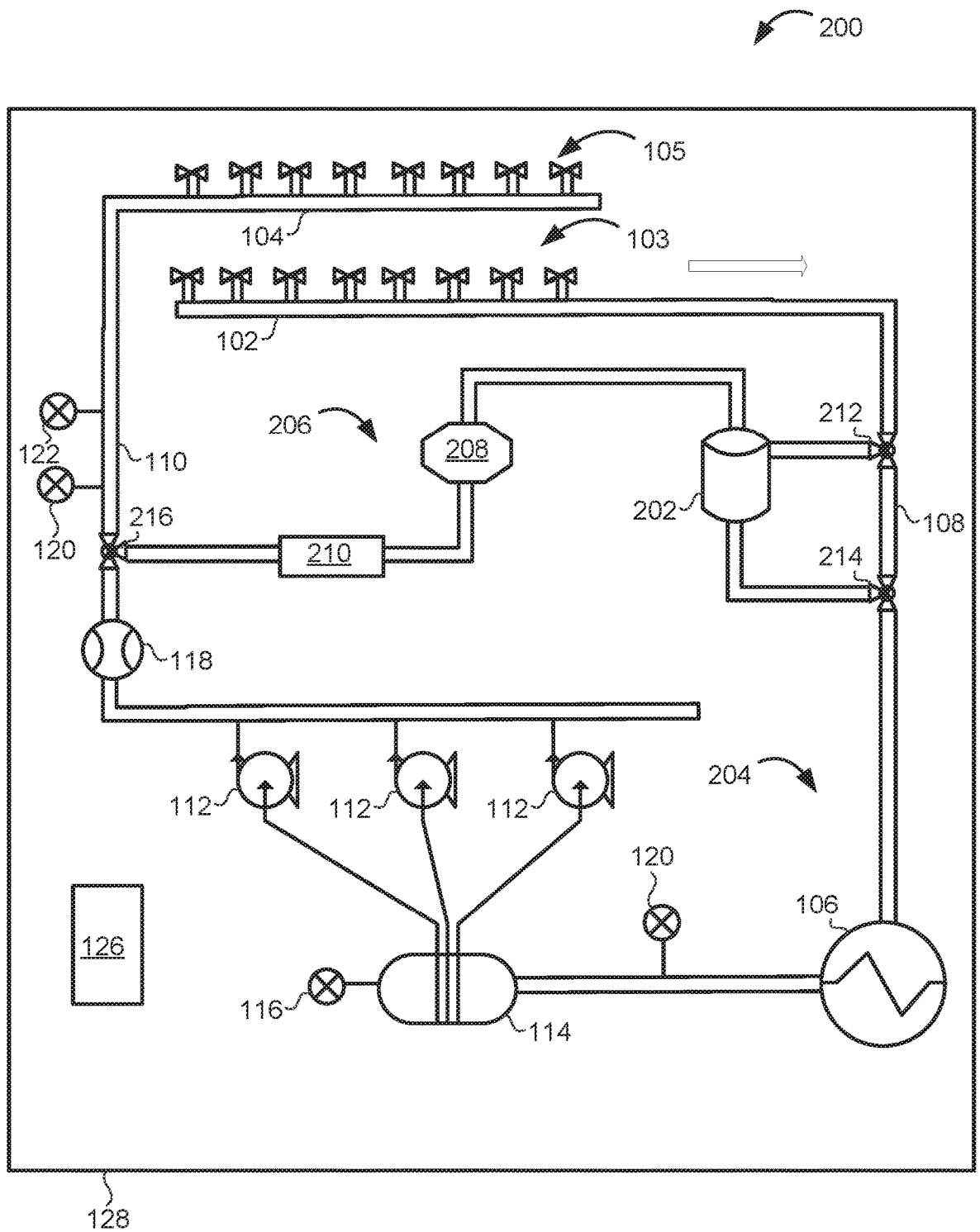
FIG. 2 illustrates a schematic view of a two-phase liquid-vapor cooling device with a phase separator, according to various embodiments.

FIG. 2 illustrates a schematic view of a two-phase liquid-vapor cooling device 200 with a phase separator 202, according to various embodiments. In some embodiments, the two-phase liquid-vapor cooling device 200 may include one or more components described with respect to the two-phase liquid-vapor cooling device 100 of FIG. 1 in a first cooling path 204, as shown. In various embodiments, the two-phase liquid-vapor cooling device 200 may also include a second cooling path 206 that may include the phase separator 202, a compressor 208, and a capillary 210. The second cooling path 206 may also include one or more fluid conductors (not labeled for clarity). In some embodiments, the compressor 208 may use a 24 volt power supply (not shown for clarity).

In various embodiments, the phase separator 202 may be coupled with the first fluid conductor 108 at a first three-way valve 212 to receive an incoming liquid-vapor mixture from the outlet manifold 102. The phase separator 202 may separate the incoming liquid-vapor mixture into a vapor (gas) flow and a liquid flow. In some embodiments, the liquid flow may be redirected back to the first fluid conductor 108 at a second three-way valve 214. In various embodiments, the vapor flow may flow to the compressor 208. In some embodiments, the compressor 208 may compress the vapor in the vapor flow. In various embodiments, the compressed vapor from the compressor 208 may flow to the capillary 210. In some embodiments, the capillary 210 may lower a pressure level of the compressed vapor from the compressor 208. In various embodiments, the capillary 210 may produce a cooled liquid flow that may be combined with liquid flowing in the second fluid conductor 110 at a third three-way valve 216.

In embodiments, the controller 126 may control one or more of the first three-way valve 212, the second three-way valve 214, or the third three-way valve 216. In some embodiments, the second cooling path 206 may not be used until needed. In other embodiments, the second cooling path 206 may remain in continuous operation with the first cooling path 204. In operation, the controller 126 may determine that additional cooling capacity is needed based at least in part on one or more sensed parameters and/or calculated characteristics (e.g., temperature, pressure, vapor quality) and may actuate the first three-way valve 212 such that some or all of the incoming liquid-vapor mixture from the outlet manifold 102 is routed to the phase separator 202 to activate the second cooling path 206. In some embodiments, the controller 126 may activate the second cooling path 206 in response to a determination that a demand for cooling power is approaching or exceeding a rated cooling power limit of the two-phase liquid-vapor cooling device 200 (e.g., 5 or 6 kW). In embodiments, the vapor from the phase separator 202 may continue to the compressor 208 and liquid from the phase separator 202 may be routed to the heat exchanger 106 through the second three-way valve 214. In embodiments, hot gases (vapor) from the compressor 208 may pass through the capillary 210 where they may be subcooled to a subcooled fluid. The subcooled fluid from the capillary 210 may then be mixed with incoming fluid from the heat exchanger 106 by routing it through the third three-way valve 216. In some embodiments, the subcooled fluid from the capillary 210 may be routed in front of one or more nodes (e.g., servers, computing devices, memory devices, storage devices, network devices) or in front of fans of the two-phase liquid-vapor cooling device 200 to cool the air before it passes into the nodes or the cooling device 200.

In various embodiments, the two-phase liquid-vapor cooling device 100 described with respect to FIG. 1 and/or the two-phase liquid-vapor cooling device 200 described with respect to FIG. 2 may be charged with a vaporizable dielectric refrigerant. In embodiments, filling may occur at a filling port (e.g., filling port 116) or may occur using one or more connections of the outlet manifold 102 and/or the inlet manifold 104 (e.g., quick disconnects 103 or 105). In some embodiments, the refrigerant may be a refrigerant fluid such as R134, HFO 1234yf, or any other suitable refrigerant fluid or mixture of refrigerant fluids. In various embodiments, use of a vaporizable dielectric refrigerant may allow for the use of aluminum parts such as cold plates and/or the use of both aluminum and copper parts in the same cooling system. The use of aluminum parts in some embodiments may reduce the weight and cost of the cooling solution compared to typical legacy single phase cooling approaches. Additionally, use of a vaporizable dielectric refrigerant may reduce the need for leak and/or condensation control because the fluid is highly dielectric and vaporizes in ambient conditions, reducing the threat of damage to electronics in various embodiments.

In various embodiments, some or all components of the two-phase liquid-vapor cooling device 100 and/or the two-phase liquid-vapor cooling device 200 may be joined together (e.g., by brazing or another technique), further reducing leak risk and increasing reliability. In embodiments, some or all components (e.g., pumps 112, fluid conductors 108, 110) of the two-phase liquid-vapor cooling device 100 and/or the two-phase liquid-vapor cooling device 200 may be able to withstand temperatures up to approximately 120 degrees Celsius. Components may have different temperature ratings in other embodiments.

Figure 3:
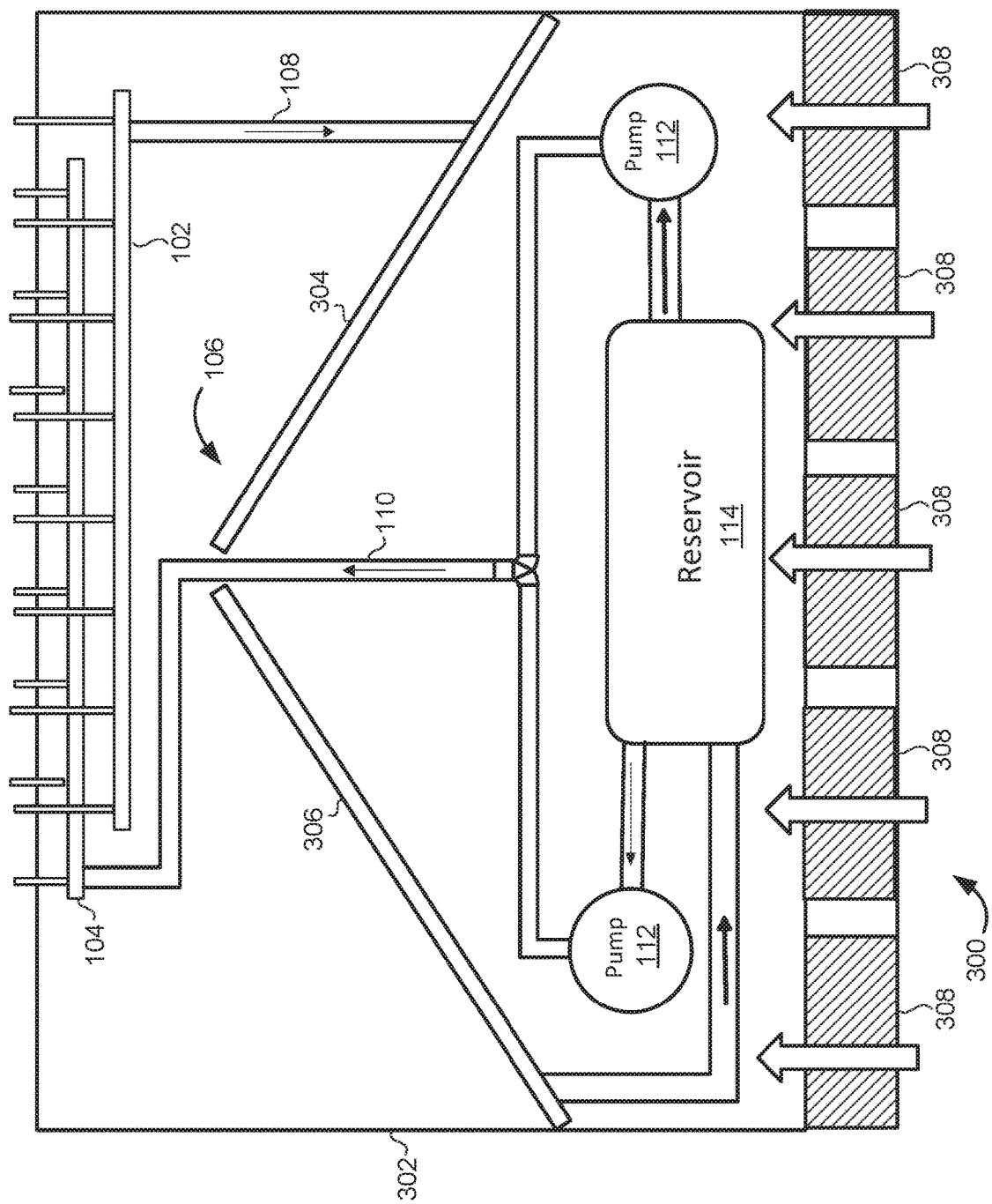
FIG. 3 illustrates a schematic top view of a two-phase liquid-vapor cooling device, according to various embodiments.

FIG. 3 illustrates a schematic top view of a two-phase liquid-vapor cooling device 300, according to various embodiments. In some embodiments, the two-phase liquid-vapor cooling device 300 may include a chassis 302. In various embodiments, the chassis 302 may enclose and/or be coupled with some or all of the components of the two-phase liquid-vapor cooling device 100 described with respect to FIG. 1, or the two-phase liquid-vapor cooling device 200 described with respect to FIG. 2, although not all such components are shown in FIG. 3 for clarity. Arrows are shown indicating a direction of fluid flow in operation, according to some embodiments. In some embodiments, the heat exchanger 106 may have a first section 304 and a second section 306 arranged in an inverted-V configuration with respect to one or more fans 308.

In some embodiments, the inverted-V configuration may be structured such that a first end of the first section 304 and a first end of the second section 306 (e.g., the ends shown proximate the second fluid conductor 110) are farther away from a front of the two-phase liquid vapor cooling device 300 than a second end of the first section 304 and a second end of the second section 306. Although the first section 304 and the second section 306 are shown to be of approximately equal length, in other embodiments, they may have different lengths and/or a different angle between them. Although the second end of the first section 304 and the second end of the second section 306 are shown to terminate at approximately the same distance from the front of the two-phase liquid vapor cooling device 300, it should be understood that they may be positioned at different distances from the front of the two-phase liquid vapor cooling device 300 in other embodiments. In various embodiments, a total length of the first section 304 in combination with the second section 306 may be greater than a width of the two-phase liquid vapor cooling device 300. Although the first section 304 and the second section 306 are shown to be in an inverted-V configuration, it should be understood than any suitable configuration may be used in various embodiments.

Although the first section 304 and the second section 306 are shown as being separated for clarity, it should be understood that fluid may flow between the sections from the first section 304 to the second section 306 during operation. In some embodiments, the one or more fans 308 may be 60 millimeter (mm) fans or 80 mm fans, but it should be understood than any suitable size fan may be included. In embodiments, at least one additional fan may be included than is needed to achieve a predetermined cooling effect to provide redundancy of at least N+1, where N is the number of fans needed to achieve the predetermined cooling effect. In various embodiments, N+1 redundancy may be included for one or more other types of components (e.g., pumps 112) where N is the number of the respective component needed to achieve the predetermined cooling effect. Arrows through the fans are shown to indicate a direction of airflow in operation, according to some embodiments.

Figure 4:
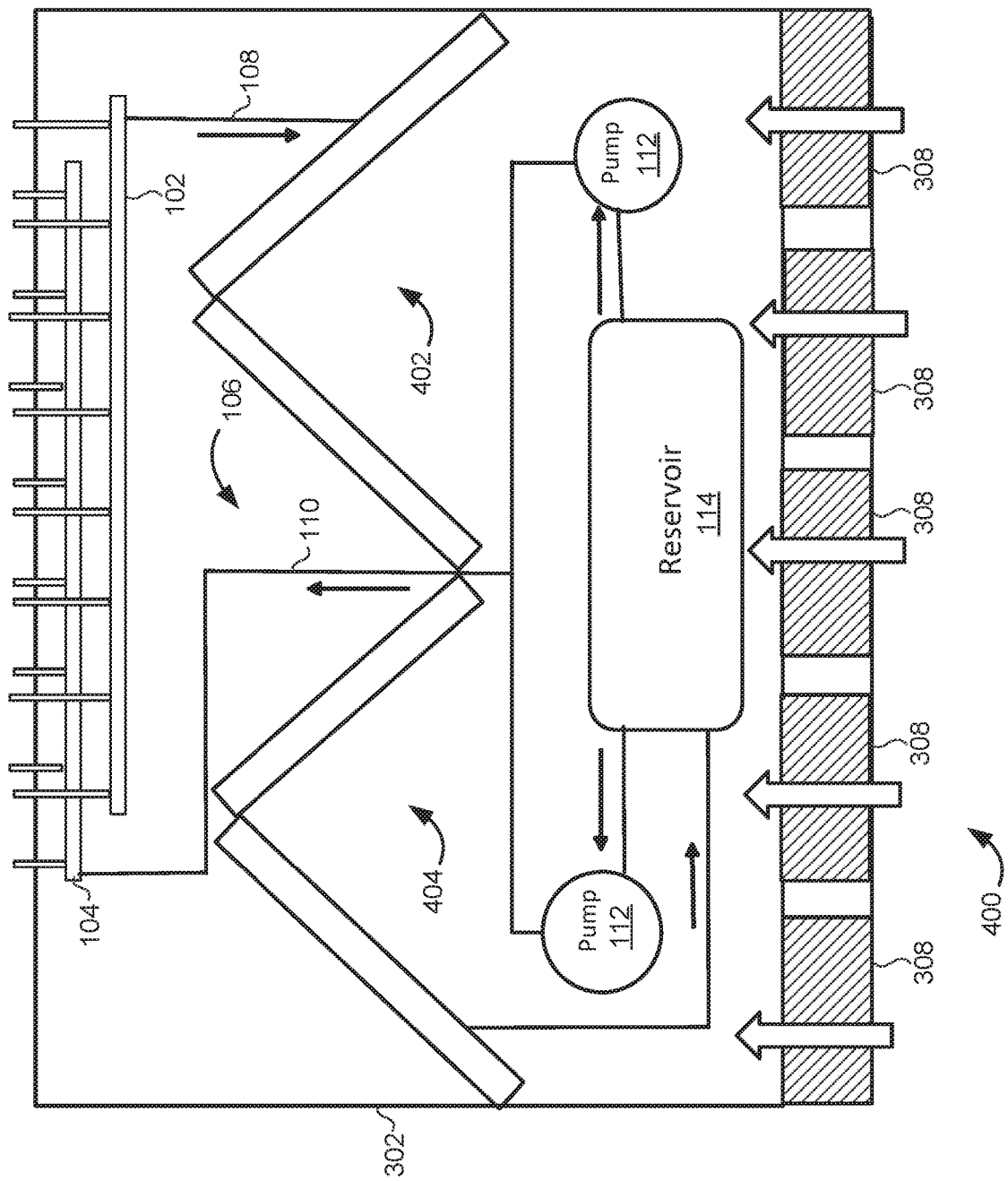
FIG. 4 illustrates a schematic top view of a two-phase liquid-vapor cooling device with a heat exchanger in an inverted-W configuration, according to various embodiments.

FIG. 4 illustrates a schematic top view of a two-phase liquid-vapor cooling device 400, according to various embodiments. In some embodiments, the two-phase liquid-vapor cooling device 400 may be structured in similar fashion to that described with respect to the two-phase liquid-vapor cooling device 300 of FIG. 3 and/or may include some or all of the components of the two-phase liquid-vapor cooling device 100 described with respect to FIG. 1, or the two-phase liquid-vapor cooling device 200 described with respect to FIG. 2, although not all such components are shown in FIG. 4 for clarity. Arrows are shown indicating a direction of fluid flow in operation, according to some embodiments. In various embodiments, the heat exchanger 106 of the two-phase liquid vapor cooling device 400 may be arranged in an inverted-W configuration with respect to fans 308. In some embodiments, the inverted-W configuration may include a first inverted-V section 402 and a second inverted-V section 404. Although the sections of the inverted-W are not shown as being fully connected for clarity, it should be understood that fluid may flow through the heat exchanger 106 from the outlet manifold 102 to the reservoir 114 during operation. The lengths of the segments of the heat exchanger 106 making up the inverted-W configuration may differ and/or the angles between them may differ in various embodiments. The heat exchanger 106 may be arranged in different configurations in other embodiments, such as by having one or more additional inverted-V sections, for example. In some embodiments, some or all of the fans 308 may not be present and/or the heat exchanger 106 may be a liquid-to-liquid heat exchanger rather than a liquid-to-air heat exchanger. Arrows through the fans are shown to indicate a direction of airflow in operation, according to some embodiments.

Figure 5:
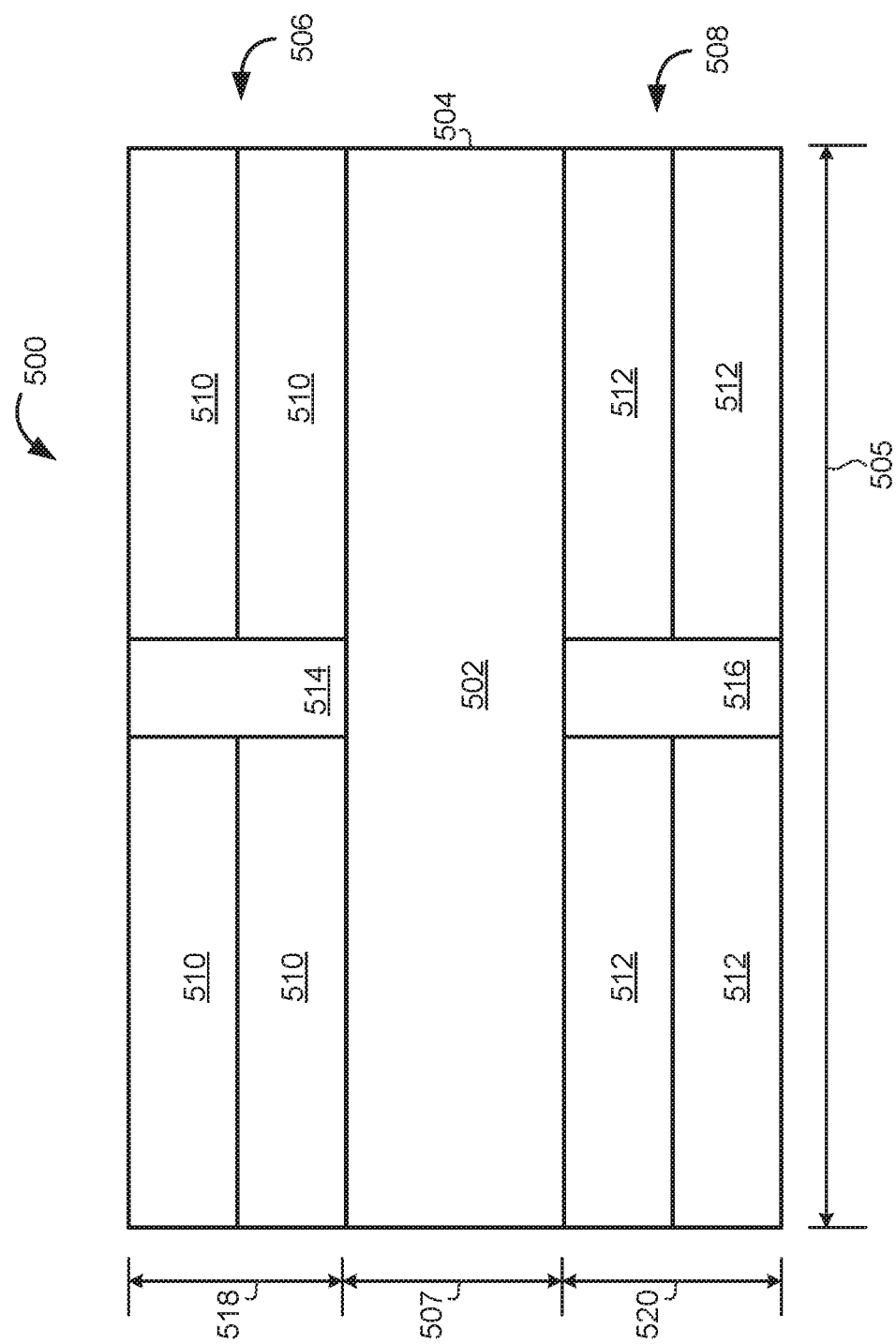
FIG. 5 illustrates a rack module that includes a two-phase liquid-vapor cooling device, in accordance with various embodiments.

FIG. 5 illustrates a rack module 500 that includes a two-phase liquid-vapor cooling device 502, in accordance with various embodiments. In some embodiments, the two-phase liquid-vapor cooling device 502 may correspond to the two-phase liquid-vapor cooling device 100 of FIG. 1, the two-phase liquid-vapor cooling device 200 of FIG. 2, the two-phase liquid-vapor cooling device 300 of FIG. 3, or the two-phase liquid-vapor cooling device 400 of FIG. 4. In various embodiments, the two-phase liquid-vapor cooling device 502 may have a chassis 504 with a width 505 of approximately 19 inches or approximately 23 inches and a height 507 of approximately 2 rack units (U). In some embodiments, the two-phase liquid-vapor cooling device 502 may include a first node unit 506 and a second node unit 508. Although the two-phase liquid-vapor cooling device 502 is shown between the first node unit 506 and the second node unit 508, it should be understood that other embodiments may have a different configuration (e.g., CDU 502 below node units 506 and 508). It should also be understood that other embodiments may have a different height, width, or other dimension.

In some embodiments, the first node unit 506 may include four computing devices 510 (e.g., compute nodes on half-width compute boards) and the second node unit 508 may include four computing devices 512. In various embodiments, the first node unit 506 and/or the second node unit 508 may include other types of nodes and/or devices (e.g., memory devices, storage devices, network devices) instead of or in addition to computing devices 510 and/or computing devices 512. In some embodiments, one or more nodes of the first node unit 506 and/or the second node unit 508 may be a blade, a sled, a tray, and/or arranged in a blade, sled, tray, or any other suitable configuration. In some embodiments, one or more nodes of the first node unit 506 and/or the second node unit 508 may include disaggregated components (e.g., compute, memory, storage, acceleration, and/or networking) in a rack scale design. In various embodiments, one or more nodes of the first node unit 506 and/or the second node unit 508 may include heterogenous devices that include more than one type of component (e.g., servers with compute, memory, and storage components). In some embodiments, the first node unit 506 may include a first power supply 514 to power the computing devices 510 and the second node unit 508 may include a second power supply 516 to power the computing devices 512. In various embodiments, the first node unit 506 and/or the second node unit 508 may be disposed in the chassis 504. In some embodiments, the first node unit 506 and/or the second node unit 508 may be disposed in one or more chassis different from the chassis 504. In some embodiments, the first node unit 506 may have a height 518 of approximately 2 U and/or the second node unit 508 may have a height 520 of approximately 2 U. The same or different types of computing nodes may be used for each of the computing devices 510 and/or the computing devices 512 in various embodiments.

Figure 6:
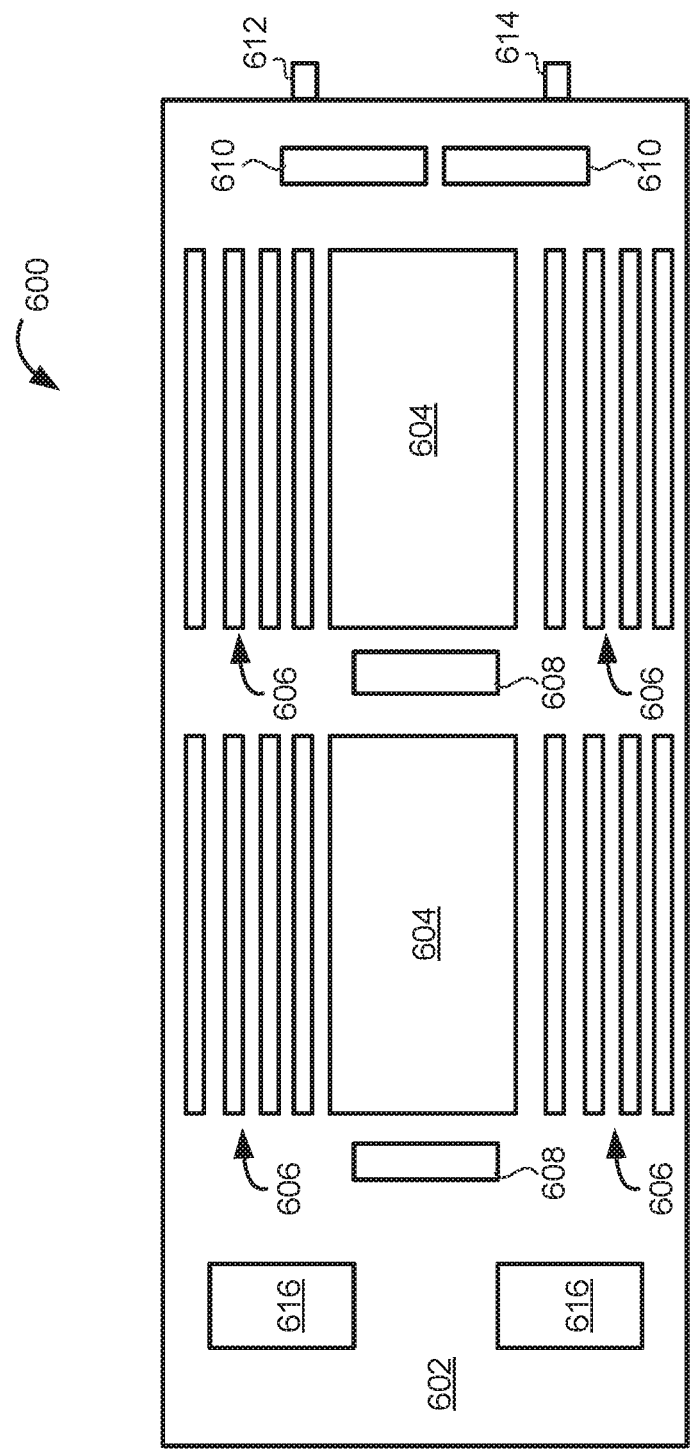
FIG. 6 illustrates a schematic view of a compute board, according to various embodiments.

FIG. 6 illustrates a schematic view of a compute board 600, according to various embodiments. In some embodiments, the compute board 600 may include a half width board 602. In various embodiments, the compute board 600 may include one or more processors 604 (e.g., a central processing unit (CPU) that may be a high TDP CPU, a graphics processing unit (GPU), a field programmable gate array (FPGA), an application specific integrated circuit (ASIC), a microcontroller, or some other type of processor). The one or more processors 604 may be implemented as integrated circuits having multi-cores, (e.g., multi-core microprocessors). The compute board 600 may also include one or more memory devices 606, one or more voltage regulators (VRs) 608, one or more peripheral component interconnect express (PCIe) cards 610, and/or one or more other components (e.g., one or more mass storage devices, communication interfaces, and/or input/output devices).

In some embodiments, one or more cold plates (not shown for clarity) may be included on the compute board 600 or may be adjacent to the compute board 600 to contact and provide heat conduction away from one or more of the components (e.g., processors 604, VRs 608, and/or other components) on the compute board 600. In various embodiments, the one or more cold plates may be coupled with one or more fluid conductors. In some embodiments, the one or more fluid conductors may include an inlet fluid conductor 612 to receive cooled fluid and an outlet fluid conductor 614 that carries fluid heated and/or changed in vapor quality level by absorbing heat from the components of the compute board 600. In some embodiments, the one or more fluid conductors may be adjacent to the compute board 600 rather than a part of the compute board 600. In some embodiments other types of conduction cooled components may be included in addition to, or instead of, cold plates.

In some embodiments, the compute board 600 may correspond to one or more of the computing devices 510 or the computing devices 512 in the first node unit 506 and/or the second node unit 508 of the rack module 500. In some embodiments, the outlet fluid conductor 614 may be coupled with a quick disconnect (e.g., a quick disconnect 103) on an outlet manifold (e.g., outlet manifold 102) of the two-phase liquid-vapor cooling device 502 and the inlet fluid conductor 612 may be coupled with a quick disconnect (e.g., quick disconnect 105) on an inlet manifold (e.g., inlet manifold 104) of the two-phase liquid-vapor cooling device 502. In some embodiments, the compute board 600 may include one or more fans 616 that may provide additional cooling (e.g., for components not coupled with a cold plate). During operation in some embodiments, the inlet fluid temperature at the inlet fluid conductor 612 may be as high as approximately 60 to 65 degrees Celsius while still meeting processor thermal requirements and other component temperature ratings. The typical and/or maximum inlet fluid temperature may be different in various embodiments. In some embodiments, components of the cooling devices, cold plates, and/or fluid conductors may be able to withstand temperatures of approximately 120 degrees Celsius. Other embodiments may have different component temperature ratings.

Figure 7:
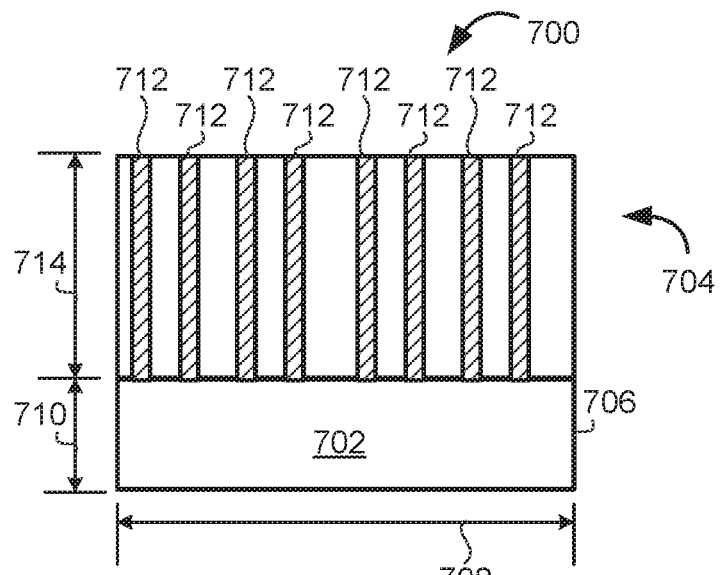
FIG. 7 illustrates a rack module that includes a two-phase liquid-vapor cooling device and a node unit arranged in a blade configuration, according to various embodiments.

FIG. 7 illustrates a rack module 700 that includes a two-phase liquid-vapor cooling device 702 and a node unit 704 arranged in a blade configuration, according to various embodiments. In some embodiments, the two-phase liquid-vapor cooling device 702 may correspond to the two-phase liquid-vapor cooling device 100 of FIG. 1, the two-phase liquid-vapor cooling device 200 of FIG. 2, the two-phase liquid-vapor cooling device 300 of FIG. 3, or the two-phase liquid-vapor cooling device 400 of FIG. 4. In various embodiments, the two-phase liquid-vapor cooling device 702 may have a chassis 706 with a width 708 of approximately 19 inches or approximately 23 inches. In some embodiments, the two-phase liquid-vapor cooling device 702 may have a height 710 of approximately 2 U. In embodiments, the node unit 704 may include eight computing devices 712 that may be arranged in a blade configuration with eight node trays. It should be understood that a different number of computing devices and/or a different configuration may be included in other embodiments. It should also be understood that the node unit 704 may include other types of devices (e.g., memory devices, storage devices, network devices) instead of or in addition to computing devices 712 in various embodiments. In some embodiments, one or more of the computing devices 712 may include one or more components corresponding to the components of the compute board 600 described with respect to FIG. 6. In some embodiments, the node unit 704 may have a height 714 of approximately 4 U. In various embodiments, the node unit 704 may be disposed in the chassis 706 and the chassis 706 may have a total height of approximately 6 U. In some embodiments, the node unit 704 may be disposed in one or more chassis different from the chassis 706 and the chassis 706 may have a height of approximately 2 U.

Although the CDUs (two-phase liquid-vapor cooling device 502, two-phase liquid-vapor cooling device 702) shown and described with respect to FIGS. 5 and 7 illustrate modules having a height of 6 U (4 U compute+2 U CDU), it should be understood that embodiments are not limited to either a 6 U form factor or a 2 U CDU. In various embodiments, the CDUs may be used to cool high TDP processors arranged in series with respect to a flow of refrigerant fluid. In embodiments, there may be little or no preheat from one processor to another, reducing the effect of thermal shadowing, due to the use of the 2-phase approach using the heat of vaporization to absorb heat and maintain temperature. This may reduce parallel flow paths for high TDP processors, which may allow for a simplified flow network and reduced pumping power in various embodiments compared to typical legacy approaches.

Figure 8:
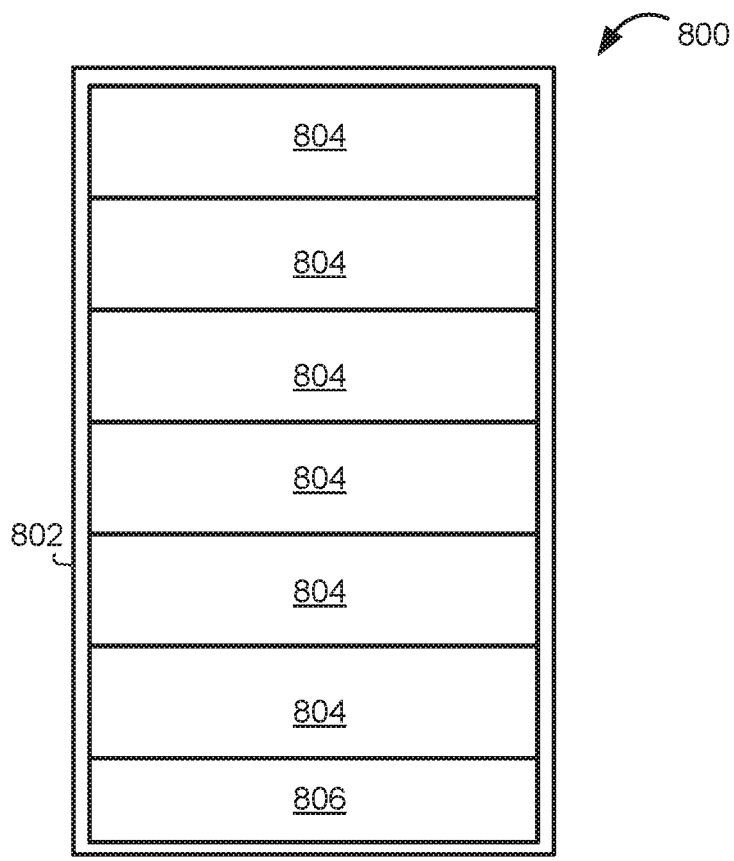
FIG. 8 illustrates a rack system including a rack with rack modules that include two-phase liquid-vapor cooling devices, according to various embodiments.

FIG. 8 illustrates a rack system 800 including a rack 802 with rack modules 804 that include two-phase liquid-vapor cooling devices, according to various embodiments. In some embodiments, the rack modules 804 may include one or more of the rack modules 500 described with respect to FIG. 5 and/or the rack modules 700 described with respect to FIG. 7. In various embodiments, the rack system 800 may include one or more other types of modules such as an accessory box 806 that may be enclosed in the rack 802. In some embodiments, each of the rack modules 500 or the rack modules 700 may be modular and/or scalable such that they may each be configured to cool N nodes (e.g., computing devices 510, computing devices 512, computing devices 712, memory devices, storage device, network devices) when disposed in the rack 802 with M other rack modules (the other rack modules 804) to cool greater than N but less than or equal to N(1+M) nodes in total. In other embodiments, the cooling capacity, modularity, and/or scalability may be configured in a different manner. In some embodiments, the rack system 800 may be configured with a disaggregated rack scale design that may include one or more separate compute, memory, storage, acceleration, network, and/or other components. In various embodiments, the rack modules 804 may cool one or more or the disaggregated components. In some embodiments, the rack system 800 may include heterogenous devices that have more than one type of component (e.g., heterogenous servers with compute, memory, and storage components), and/or the rack modules 800 may cool one or more components of the heterogenous devices.

In various embodiments, components of the rack system 800 may provide for cooling of high TDP processors in series, with the same case or junction temperature at a higher inlet fluid temperature than typical legacy approaches. In some embodiments, components of the rack system 800 may support continuous Turbo mode, each rack module 804 may provide for approximately 5-6 kilowatts (kW) of in rack liquid-to-air cooling in existing air cooled datacenters, and may be scalable to an air cooled rack of approximately 45 kW with green field rack level airflow boundary conditions for the rack system 800. Although embodiments have been described in relation to rack modules and a rack system that includes a rack, it should be understood that the two-phase liquid-vapor cooling device 100 of FIG. 1, the two-phase liquid-vapor cooling device 200 of FIG. 2, the two-phase liquid-vapor cooling device 300 of FIG. 3, the two-phase liquid-vapor cooling device 400 of FIG. 4, and/or other components described with respect to those or other figures may be used in other contexts and/or use cases in some embodiments (e.g., in an autonomous or semi-autonomous vehicle, or in a high performance computing (HPC) device having some other type of configuration).

EXAMPLES

Example 1 may include a cooling device comprising: a heat exchanger; an inlet manifold; an outlet manifold; one or more fluid conductors coupled with the heat exchanger, the inlet manifold, and the outlet manifold to carry a two-phase fluid from the outlet manifold to the inlet manifold through the heat exchanger; and one or more fans to generate a flow of air against the heat exchanger, wherein the heat exchanger is arranged in an inverted-V formation or an inverted-W formation in relation to the one or more fans.

Example 2 may include the subject matter of Example 1, further comprising: a phase separator coupled with the inlet manifold to separate a liquid phase and a vapor phase of the 2-phase liquid-vapor mixture; and a compressor coupled with the phase separator to compress vapor from the phase separator.

Example 3 may include the subject matter of Example 2, further comprising: a capillary coupled with the compressor to lower a pressure level of compressed vapor from the compressor; and one or more three-way valves coupled with one or more of the phase separator and the capillary.

Example 4 may include the subject matter of any one of Examples 1-3, further comprising: a sensor to sense a physical characteristic of the two-phase liquid-vapor mixture; one or more pumps coupled with one or more of the one or more fluid conductors to pump the two-phase liquid-vapor mixture; and a controller to control the one or more pumps and the one or more fans based at least in part on the physical characteristic.

Example 5 may include the subject matter of Example 4, wherein the physical characteristic is a flow rate or a temperature of the two-phase liquid-vapor mixture.

Example 6 may include the subject matter of Example 5, wherein the controller is to calculate a vapor quality level of the two-phase liquid-vapor mixture based at least in part on the physical characteristic and the controller is to control the one or more pumps and the one or more fans to maintain the vapor quality level within a predetermined range.

Example 7 may include the subject matter of any one of Examples 1-6, further comprising a refrigerant fluid in the one or more fluid conductors.

Example 8 may include the subject matter of Example 7, wherein the refrigerant fluid is R134a or HFO 1234yf.

Example 9 may include the subject matter of any one of Examples 1-8, further comprising a reservoir coupled with one or more of the one or more fluid conductors.

Example 10 may include a rack module comprising: a cooling unit that includes: a heat exchanger; one or more fluid conductors coupled with the heat exchanger to carry a multi-phase fluid to be received from N nodes through the heat exchanger; and one or more fans to generate a flow of air against the heat exchanger; and a chassis, wherein the cooling unit is disposed in the chassis, and wherein the rack module is to cool the N nodes, and is to be disposed in a rack with M other rack modules to cool greater than N but less than or equal to N(1+M) nodes.

Example 11 may include the subject matter of Example 10, wherein the chassis has a width of approximately 19 inches or approximately 23 inches.

Example 12 may include the subject matter of any one of Examples 10-11, wherein the heat exchanger is arranged in the chassis in an inverted-V formation or an inverted-W formation in relation to the one or more fans.

Example 13 may include the subject matter of any one of Examples 10-12, wherein the multi-phase fluid is a 2-phase liquid-vapor mixture and the rack module further comprises: a phase separator coupled with the inlet manifold to separate a liquid phase and a vapor phase of the 2-phase liquid-vapor mixture; and a compressor coupled with the phase separator to compress vapor from the phase separator, wherein the phase separator and the compressor are disposed in the chassis.

Example 14 may include the subject matter of any one of Examples 10-13, further comprising a refrigerant fluid in the one or more fluid conductors.

Example 15 may include the subject matter of any one of Examples 10-14, wherein the cooling unit further includes: an inlet manifold; an outlet manifold; and one or more quick disconnects on the inlet manifold and the outlet manifold, wherein the one or more fluid conductors are to carry the multi-phase fluid from the outlet manifold to the inlet manifold through the heat exchanger.

Example 16 may include the subject matter of any one of Examples 10-15, further comprising one or more node units disposed in the chassis.

Example 17 may include the subject matter of Example 16, wherein the one or more node units include a plurality of computing devices arranged in a blade configuration with a height of approximately 4 rack units (U), wherein the chassis has a height of approximately 6 U.

Example 18 may include the subject matter of Example 16, wherein the one or more node units include: a first node unit having 4 nodes; and a second node unit having 4 nodes, wherein the first node unit has a height of approximately 2 U, the second node unit has a height of approximately 2 U, the cooling unit has a height of approximately 2 U, and the chassis has a height of approximately 6 U.

Example 19 may include a rack system comprising: a rack; a set of nodes disposed in the rack; and a cooling module that includes: a cooling unit to cool the set of nodes having: a heat exchanger; one or more fluid conductors coupled with the heat exchanger to carry a two-phase liquid-vapor mixture through the heat exchanger; and one more fans to generate a flow of air against the heat exchanger; and a chassis, wherein the cooling unit is disposed in the chassis and the chassis is disposed in the rack.

Example 20 may include the subject matter of Example 19, wherein the cooling module is a first cooling module, the set of nodes is a first set of nodes, and the rack system further comprises: one or more additional sets of nodes disposed in the rack; and one or more additional cooling modules to cool the one or more additional sets of nodes, wherein the one or more additional cooling modules each include: a cooling unit having: a heat exchanger; one or more fluid conductors coupled with the heat exchanger to carry a two-phase liquid-vapor mixture through the heat exchanger; and one or more fans to generate a flow of air against the heat exchanger; and a chassis, wherein the cooling unit is disposed in the chassis and the chassis is disposed in the rack such that two or more cooling modules are disposed in the rack.

Example 21 may include the subject matter of Example 20, wherein the rack is to receive modules with a width of approximately 19 inches or approximately 23 inches and the two or more cooling modules have a width of approximately 19 inches or approximately 23 inches.

Example 22 may include the subject matter of any one of Examples 20-21, wherein each cooling unit of the two or more computer cooling modules has a height of approximately 2 rack units (U).

Example 23 may include the subject matter of any one of Examples 20-22, wherein each cooling unit further includes: an inlet manifold; and an outlet manifold, wherein: the first set of nodes is disposed in a first computer device unit coupled with the inlet manifold and the outlet manifold of a first one of the two or more cooling modules; a second set of nodes of the one or more additional sets of nodes is disposed in a second computer device unit coupled with the inlet manifold and the outlet manifold of a second one of the two or more cooling modules; and the first computer device unit and the second computer device units are disposed in the rack.

Example 24 may include the subject matter of Example 23, wherein the first computer device unit is disposed in the chassis of the first cooling module.

Example 25 may include the subject matter of any one of Examples 23-24, wherein the first computer device unit is arranged in a blade configuration and has a height of approximately 4 U.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations of the present specification, including what is described in the Abstract, is not intended to be exhaustive or to limit the specification to the precise forms disclosed. While specific implementations of, and examples for, the present specification are described herein for illustrative purposes, various equivalent modifications are possible within the scope of the specification, as those skilled in the relevant art will recognize.

These modifications may be made to the disclosed embodiments in light of the above detailed description. The terms used in the following claims should not be construed to limit the present specification to the specific implementations disclosed in the specification and the claims. Rather, the scope of the present specification is to be determined entirely by the following claims, which are to be construed in accordance with established doctrines of claim interpretation.

What is claimed is:

1. A cooling device comprising:
a heat exchanger;
an inlet manifold;
an outlet manifold;
one or more fluid conductors coupled with the heat exchanger, the inlet manifold, and the outlet manifold to carry a two-phase fluid from the outlet manifold to the inlet manifold through the heat exchanger;
one or more fans to generate a flow of air against the heat exchanger, wherein the heat exchanger is arranged in an inverted-V formation or an inverted-W formation in relation to the one or more fans;
a phase separator coupled with the inlet manifold to separate a liquid phase and a vapor phase of a two-phase liquid-vapor mixture;
a compressor disposed upstream of the heat exchanger, and coupled with the phase separator to compress vapor from the phase separator; and
a capillary directly coupled with the compressor to provide a compressed vapor transmission path downstream of the heat exchanger, bypassing the heat exchanger, to lower a pressure level of compressed vapor from the compressor.

2. The cooling device of claim 1, further comprising:
one or more three-way valves coupled with one or more of the phase separator and the capillary.

3. The cooling device of claim 1, further comprising:
a sensor to sense a physical characteristic of the two-phase liquid-vapor mixture;
one or more pumps coupled with one or more of the one or more fluid conductors to pump the two-phase liquid-vapor mixture; and
a controller to control the one or more pumps and the one or more fans based at least in part on the physical characteristic.

4. The cooling device of claim 3, wherein the physical characteristic is a flow rate or a temperature of the two-phase liquid-vapor mixture.

5. The cooling device of claim 4, wherein the controller is to calculate a vapor quality level of the two-phase liquid-vapor mixture based at least in part on the physical characteristic and the controller is to control the one or more pumps and the one or more fans to maintain the vapor quality level within a predetermined range.

6. The cooling device of claim 1, further comprising a refrigerant fluid in the one or more fluid conductors.

7. The cooling device of claim 6, wherein the refrigerant fluid is R134a or HFO 1234yf.

8. The cooling device of claim 1, further comprising a reservoir coupled with one or more of the one or more fluid conductors.

9. A rack module comprising:
a cooling unit that includes:
a heat exchanger;
one or more fluid conductors coupled with the heat exchanger to carry a multi-phase fluid to be received from N nodes through the heat exchanger; and
a phase separator coupled with an inlet manifold to separate a liquid phase and a vapor phase of the multi-phase fluid;
a compressor disposed upstream of the heat exchanger coupled with the phase separator to compress vapor from the phase separator;
a capillary directly coupled with the compressor to provide a compressed vapor transmission path downstream of the heat exchanger to lower a pressure level of compressed vapor from the compressor, and wherein the phase separator is to be activated or deactivated by a controller based upon a sensed physical characteristic of the multi-phase fluid; and
a chassis, wherein the cooling unit is disposed in the chassis, and wherein the rack module is to cool the N nodes, and is to be disposed in a rack with M other rack modules to cool greater than N but less than or equal to N(1+M) nodes.

10. The rack module of claim 9, wherein the chassis has a width of approximately 19 inches or approximately 23 inches.

11. The rack module of claim 10, wherein the heat exchanger is arranged in the chassis in an inverted-V formation or an inverted-W formation in relation to one or more fans.

12. The rack module of claim 9, wherein the multi-phase fluid is a 2-phase liquid-vapor mixture; and
wherein the phase separator and the compressor are disposed in the chassis.

13. The rack module of claim 9, further comprising a refrigerant fluid in the one or more fluid conductors.

14. The rack module of claim 9, wherein the cooling unit further includes:
an inlet manifold;
an outlet manifold; and
one or more quick disconnects on the inlet manifold and the outlet manifold, wherein the one or more fluid conductors are to carry the multi-phase fluid from the outlet manifold to the inlet manifold through the heat exchanger.

15. The rack module of claim 9, further comprising one or more node units disposed in the chassis.

16. The rack module of claim 15, wherein the one or more node units include a plurality of computing devices arranged in a blade configuration with a height of approximately 4 rack units (U), wherein the chassis has a height of approximately 6 U.

17. The rack module of claim 15, wherein the one or more node units include:
 a first node unit having 4 nodes; and
 a second node unit having 4 nodes, wherein the first node unit has a height of approximately 2 U, the second node unit has a height of approximately 2 U, the cooling unit has a height of approximately 2 U, and the chassis has a height of approximately 6 U.

18. A rack system comprising:
 a rack;
 a set of nodes disposed in the rack; and
 a cooling module that includes:
  a cooling unit to cool the set of nodes having:
   a heat exchanger;
   one or more fluid conductors coupled with the heat exchanger to carry a two-phase liquid-vapor mixture through the heat exchanger;
   one more fans to generate a flow of air obliquely against the heat exchanger, wherein the heat exchanger is arranged in an inverted-V formation or an inverted-W formation in relation to the one or more fans;
   a phase separator coupled with an inlet manifold to separate a liquid phase and a vapor phase of the multi-phase liquid-vapor mixture;
   a compressor disposed upstream of the heat exchanger coupled with the phase separator to compress vapor from the phase separator; and
   a capillary directly coupled with the compressor to provide a compressed vapor transmission path downstream of the heat exchanger to lower a pressure level of compressed vapor from the compressor; and
  a chassis, wherein the cooling unit is disposed in the chassis and the chassis is disposed in the rack.

19. The rack system of claim 18, wherein the cooling module is a first cooling module, the set of nodes is a first set of nodes, and the rack system further comprises:
 one or more additional sets of nodes disposed in the rack; and
 one or more additional cooling modules to cool the one or more additional sets of nodes, wherein the one or more additional cooling modules each include:
  a cooling unit having:
   a heat exchanger;
   one or more fluid conductors coupled with the heat exchanger to carry a two-phase liquid-vapor mixture through the heat exchanger; and
   one or more fans to generate a flow of air against the heat exchanger; and
  a chassis, wherein the cooling unit is disposed in the chassis and the chassis is disposed in the rack such that two or more cooling modules are disposed in the rack.

20. The rack system of claim 19, wherein the rack is to receive modules with a width of approximately 19 inches or approximately 23 inches and the two or more cooling modules have a width of approximately 19 inches or approximately 23 inches.

21. The rack system of claim 20, wherein each cooling unit of the two or more computer cooling modules has a height of approximately 2 rack units (U).

22. The rack system of claim 21, wherein each cooling unit further includes:
 an inlet manifold; and
 an outlet manifold, wherein:
  the first set of nodes is disposed in a first computer device unit coupled with the inlet manifold and the outlet manifold of a first one of the two or more cooling modules;
  a second set of nodes of the one or more additional sets of nodes is disposed in a second computer device unit coupled with the inlet manifold and the outlet manifold of a second one of the two or more cooling modules; and
  the first computer device unit and the second computer device units are disposed in the rack.

23. The rack system of claim 22, wherein the first computer device unit is disposed in the chassis of the first cooling module.

24. The rack system of claim 23, wherein the first computer device unit is arranged in a blade configuration and has a height of approximately 4 U.

* * * * *